United States Patent [19]

Naarmann et al.

[11] Patent Number: 4,518,535

[45] Date of Patent: May 21, 1985

[54] PREPARATION OF ELECTRICALLY CONDUCTIVE SYSTEMS FROM SUBSTITUTED PHENALENES, AND THE PRODUCTS OBTAINED

[75] Inventors: Herbert Naarmann, Wattenheim; Volker Muench, Ludwigshafen; Gernot Köhler, Ludwigshafen; Petr Simak, Ludwigshafen, all of Fed. Rep. of Germany

[73] Assignee: BASF Aktiengesellschaft, Fed. Rep. of Germany

[21] Appl. No.: 491,717

[22] Filed: May 5, 1983

[30] Foreign Application Priority Data

May 7, 1982 [DE] Fed. Rep. of Germany ....... 3217097

[51] Int. Cl.³ .................... C07F 1/08; C07F 1/10; C07F 15/00; C07F 15/02
[52] U.S. Cl. ................ 260/438.1; 260/429 J; 260/439 R
[58] Field of Search ............. 260/429 J, 439 R, 438.1

[56] References Cited

U.S. PATENT DOCUMENTS

| | | | |
|---|---|---|---|
| 3,167,579 | 1/1965 | Fields et al. | 260/429 J X |
| 3,177,232 | 4/1965 | Muetterties | 260/429 J X |
| 3,177,237 | 4/1965 | Muetterties | 260/429 J |
| 3,772,354 | 11/1973 | Fredricks et al. | 260/429 J X |
| 3,876,675 | 4/1975 | Trofimenko | 260/429 J |
| 3,953,874 | 4/1976 | Aviram et al. | 260/429 J |
| 4,093,598 | 6/1978 | Banucci et al. | 260/429 J X |
| 4,440,693 | 4/1984 | Naarmann et al. | 260/439 R |

OTHER PUBLICATIONS

Chemical Abstracts 755554s, (1971).
Chemical Abstracts 100103564z, (1982).
J. Organometallic Chemistry 172(3)c43–c46, (1979).
J. Organometallic Chemistry 187(1)c11–c14, (1980).
M. Harnack, Nachr. Chem. Techn. Lab. 28 (9) (1980), 632–636.
Angew. Chem., 81 (1964), 10–17.
Annals of the New York Academy of Sciences, vol. 313, (1978), "Synthesis and Properties of Law-Dimensional Materials" Ed. Joel S. Miller and J. Epstein, pp. 8–24, 25–60, 594–616, 633–650.
Z. Naturforschunt, Part B, 28 (3–4), (1973), pp. 164–167.
Inorg. Nucl. Chem. Lett. 10, (1974), 467–471.

*Primary Examiner*—Helen M. S. Sneed
*Attorney, Agent, or Firm*—Keil & Weinkauf

[57] ABSTRACT

Air-stable, electrically conductive systems having conductivities greater than $1 \times 10^{-3} \Omega^{-1} cm^{-1}$ are prepared by reacting a metal cation of an element of sub-group VII, VIII or I of the periodic table with a 1,9-substituted phenalene of the general formula (I)

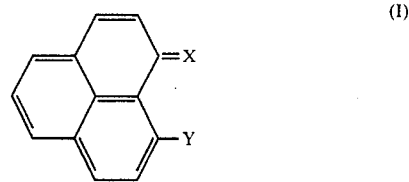

where X is O, NH, S, Se or Te and Y is OH, $NH_2$ or SH, to give a metal chelate, and oxidizing this metal chelate by means of an organic electron acceptor. The electrically conductive systems can be used in the electrical industry for the production of solar cells and for converting and fixing radiation, for producing electric and magnetic switches and electrochemical stores, and for the antistatic treatment of plastics.

11 Claims, No Drawings

PREPARATION OF ELECTRICALLY CONDUCTIVE SYSTEMS FROM SUBSTITUTED PHENALENES, AND THE PRODUCTS OBTAINED

The present invention relates to a process for the preparation of air-stable, electrically conductive systems having conductivities greater than $1 \times 10^{-3} \Omega^{-1} \text{cm}^{-1}$ by reacting a metal cation of an element of sub-group VII, VIII or I of the periodic table with a 1,9-substituted phenalene to give a metal chelate, and oxidizing this metal chelate to give the electrically conductive system. The present invention furthermore relates to the products obtained by this process.

In the novel process, a transition metal cation $Me^{n\oplus}$ is reacted with a 1,9-substituted phenalene to give a transition metal chelate having a pseudo-one-dimensional polymeric structure, and this chelate compound is then oxidized.

It has been disclosed that organometallic polymers which possess a direct metal-metal interaction or a metal-ligand-metal linkage can be converted to pseudo-one-dimensional electrically conductive systems (cf. M. Harnack, Nachr. Chem. Techn. Lab. 28 (9) (1980), 632).

Examples of known polymer systems containing transition metal cations are tetracyanoplatinate(II) complexes, which crystallize as columnar structures with Pt-Pt contacts (cf. Angew. Chem., 81 (1964), 10). Partial oxidation of these complexes gives polymers of mixed valency. Transition metal chelates with tetraazaporphines, phthalocyanines, dimethylglyoximes, diphenylglyoximes, dithioacetates and other organic compounds suitable for metal chelate formation have also been disclosed (cf. Annals of the New York Academy of Sciences, Synthesis and Properties of Low-Dimensional Materials, edit. J. S. Miller and A. J. Epstein, Vol. 313, New York 1978, pages 9 et seq., 25 et seq., 594 et seq. and 633 et seq.). Z. Naturforschung, Part B, 28 (3–4) (1973), 164–167, describes planar dicarbonylrhodium(I) and dicarbonyliridium(I) complexes with polarizable aromatic ligands, and, inter alia, also mentions the rhodium(I) complex with 9-hydroxyphenalen-1-one. However, this publication does not particularly single out the chelate of substituted phenalene, nor does it discuss the suitability of this complex for the preparation of air-stable, electrically conductive systems.

It has also been disclosed that, for example, bis(diphenylglyoximato)-Ni(II) complexes, which are planar and crystallize with stack structures, can be oxidized with iodine to give the electrically conductive compound bis-(diphenylglyoximato) Ni.I. The conductivity of the latter compound is from $10^{-3}$ to $10^{-2}\Omega^{-1}\text{cm}^{-1}$, which is eight times the conductivity of the starting compound (cf. Inorg. Nucl. Chem. Lett. 10 (1974), 467). In compounds of this type, the iodide anions form polymeric chains which are located in channel between the stacks and run in the direction of stacking, and are surrounded by the aromatic radicals.

Other known electrically conductive polymers, for example polyacetylenes oxidized with iodine, have the disadvantage that they have to be prepared and handled strictly in the absence of air. On contact with air, they absorb oxygen very rapidly and their conductivities decrease by one or two orders of magnitude.

Copending U.S. patent application Ser. No. 327,726, filed Dec. 12, 1981 now U.S. Pat. No. 4,440,693, of the same assignee, proposes the preparation of air-stable, electrically conductive polymers having conductivities greater than $10^{-3}\Omega^{-1}\text{cm}^{-1}$ by a method wherein a metal cation of sub-group VII, VIII or I of the periodic table of elements is reacted with a 1,9-substituted phenalene to give a metal chelate, which is then oxidized with an inorganic oxidizing agent, eg. $AsF_5$, $SbF_5$, $SbCl_5$, $Cl_2$, $Br_2$ or $I_2$, to give the desired polymer.

It is an object of the present invention to provide a further process which permits the preparation, in a simple manner, of novel electrically conductive systems which have conductivities greater than $1 \times 10^{-3}\Omega^{-1}\text{cm}^{-1}$ and are stable in air. These systems should possess conductivities greater than $10^{-3}\Omega^{-1}\text{cm}^{-1}$ even in powder form, and not just in the form of highly ordered single crystals, so that their usefulness and range of applications in the electrical industry are substantially increased as a result.

We have found that this object is achieved, in accordance with the invention, if transition metal chelates of 1,9-substituted phenalenes are oxidized with an organic electron acceptor.

The present invention accordingly relates to a process for the preparation of air-stable, electrically conductive systems having conductivities greater than $10^{-3}\Omega^{-1}\text{cm}^{-1}$ by reacting a metal cation of an element of sub-group VII, VIII or I of the periodic table of elements with a 1,9-substituted phenalene of the general formula (I)

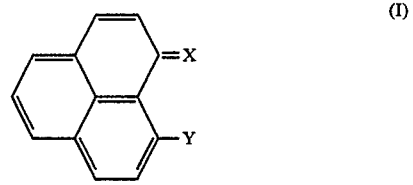

where X is O, NH, S, Se or Te and Y is —OH, —SH or —NH$_2$, to give a metal chelate, and oxidizing this metal chelate to the electrically conductive system by means of an oxidizing agent, wherein an organic electron acceptor is employed as the oxidizing agent.

For the purposes of the invention, air-stable, electrically conductive systems are those which have polymeric structures and conductivities greater than $1 \times 10^{-3}\Omega^{-1}\text{cm}^{-1}$ and remain stable in air at from 0° to 100° C. over a period of 20 days or longer. The electrical conductivities are measured at 30° C. and expressed in $\Omega^{-1}\text{cm}^{-1}$; the measurement itself is carried out by the method described by F. Beck, Ber. Bunsenges. Phys. Chem. 68 (1964), 558–567.

In the novel process, a metal cation of an element of sub-group VII, VIII or I of the periodic table is first reacted with a 1,9-substituted phenalene to give a metal chelate.

For this purpose, a metal cation, eg. that of Mn, Te, Re, Fe, Ru, Os, Co, Rh, Ir, Ni, Pd, Pt, Cu or Ag, preferably of Fe, Ni, Pd, Pt, or Cu, is employed as starting material in the form of a salt, eg. the halide, complex halide, sulfate, nitrate, phosphate, perchlorate, trifluoromethanesulfonate or acetate. Examples of suitable salts of this type are manganese acetate, iron(II) sulfate, cobalt(II) acetate, nickel(II) acetate, palladium(II) chloride and potassium tetrachloroplatinate(II). Nickel(II) acetate and palladium salts are particularly suitable.

Suitable 1,9-substituted phenalenes (perinaphthylenes) are those of the general formula (I)

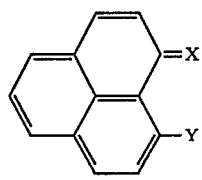

(I)

where X is O, NH, S, Se or Te and Y is OH, NH₂ or SH. Particularly advantageous compounds of the formula (I) are those in which X is O, NH or S, in particular O. The compound in which X is O and Y is NH₂, ie. 9-aminophenalen-1-one, is particularly preferred. The phenalenes of the formula (I) which are employed according to the invention are known per se, and are described in J. Org. Chem. 44 (1979), 1704; Tetrahedron 34 (1978), 2147; and British Pat. No. 1,388,417. They are completely planar aromatic $C_{13}$-hydrocarbons.

The reaction of the metal salt with the 1,9-substituted phenalene of the general formula (I) is preferably carried out in solution. The metal salt and the substituted phenalene are usually employed for the reaction in stoichiometric amounts, ie. the ratio of these amounts depends on the coordination of the metal cation in the chelate. The reaction is carried out in general at from 20° C. to the boiling point of the solvent. In a particularly preferred procedure, the metal salt is dissolved in an ethanol/water mixture (volumetric ratio 1:1), and the solution is then mixed with a solution of the substituted phenalene in ethanol. To accelerate the reaction, it is advantageous to heat the mixture at the boiling point of the solvent, eg. of the ethanol/water mixture. During this procedure, the sparingly soluble metal chelate is precipitated from the solution, and can be purified by recrystallization from a higher alcohol, preferably n-butanol, and obtained in anhydrous form. In another, particularly preferred procedure, a solution of 1 mole of the particular 1,9-substituted phenalene in ethanol is heated at the boil, ie. at from 70° to 80° C., and one half mole of nickel(II) acetate or of a Pd(II) salt in ethanol/H₂O (volumetric ratio 1:1) is added dropwise at this temperature. The metal chelate is precipitated in high purity and yield during this procedure.

The metal chelate obtained in the first stage of the process is oxidized, in accordance with the invention, using an organic electron acceptor as the oxidizing agent. Particularly suitable oxidizing agents are the quinones, quinone methides and nitroaromatics.

The quinones, as described in, for example, The Chemistry of Quinoid Compounds in The Chemistry of Functional Groups, Parts 1 and 2, editor S. Patai, John Wiley publisher, New York (1974), include, inter alia, the benzoquinones, 1,4-naphthoquinones, 1,6-naphthoquinones, anthraquinones, polynuclear quinones and non-benzoid quinones.

Preferred benzoquinones are those of the general formulae (IIa) and (IIb)

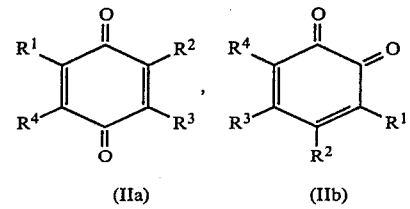

where $R^1$, $R^2$, $R^3$ and $R^4$ are identical or different and are each H, F, Cl, Br, I, CN, CF₃, C₂F₅, OH, NO₂, COOR⁵ or OR⁵, where $R^5$ is alkyl (in particular $C_1$-$C_8$-alkyl, eg. CH₃, C₂H₅, C₃H₇ or C₄H₉), cycloalkyl (in particular $C_6$-$C_{12}$-cycloalkyl, eg. cyclohexyl) or aryl (in particular $C_6$-$C_{12}$-aryl, eg. phenyl). The oxidation potential of the compounds is in general higher the greater the number of radicals $R^1$, $R^2$, $R^3$ and $R^4$ which are radicals other than H. In the novel process, preferred compounds are therefore those in which not more than three, preferably not more than two, of the radicals $R^1$, $R^2$, $R^3$ and $R^4$ are H. Particularly preferred compounds are those in which $R^1$, $R^2$, $R^3$ and $R^4$ are identical or different and are each Cl, Br, CN or CF₃, and some of these radicals may furthermore be H. Examples of suitable benzoquinones are p-benzoquinone, o-benzoquinone, p-chloranil, p-bromanil and p-iodanil.

Suitable naphthoquinones include those of the general formulae (III) and (IV)

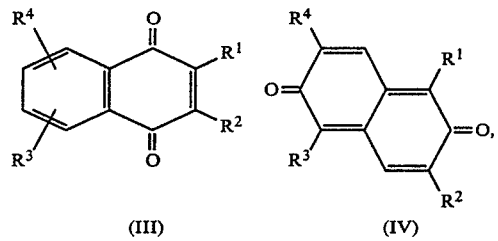

where $R^1$, $R^2$, $R^3$ and $R^4$ have the above meanings.

Particularly suitable anthraquinones are those of the general formula (V)

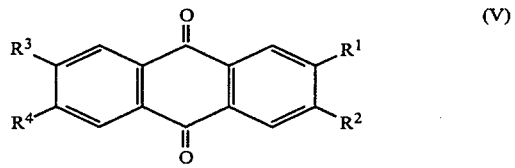

where $R^1$, $R^2$, $R^3$ and $R^4$ likewise have the above meanings.

Polynuclear quinones which can be used as oxidizing agents in the novel process are, for example, of the general formula (VI)

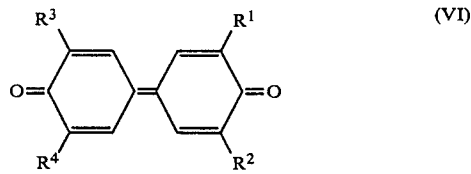

where $R^1$, $R^2$, $R^3$ and $R^4$ have the above meanings. Particularly advantageous polynuclear quinones of the general formula (VI) are those in which $R^1$, $R^2$, $R^3$ and $R^4$ are each methyl, for example tetramethyldiphenoquinone.

Examples of non-benzoid quinones which can be employed in accordance with the invention are the compounds of the general formulae (VII) to (XIV) below:

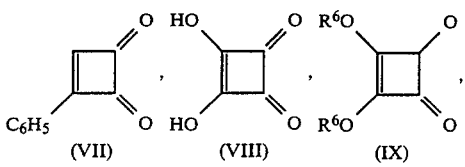

(VII)    (VIII)    (IX)

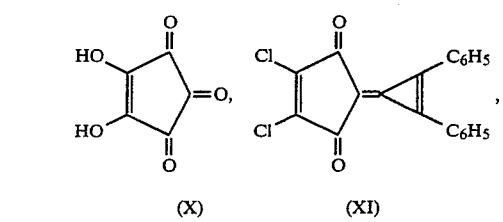

(X)    (XI)

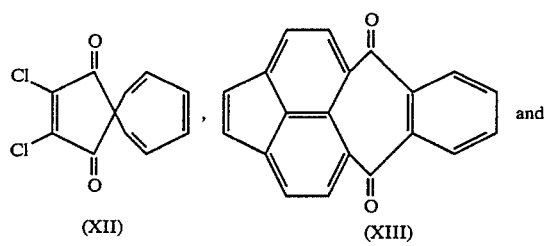

(XII)    (XIII)

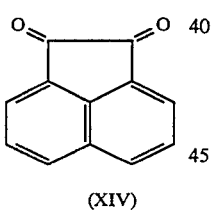

(XIV)

In formula (IX), $R^6$ is $C_1$–$C_4$-alkyl or $C_6$–$C_{12}$-cycloalkyl, in particular $CH_3$, $C_2H_5$ or $C_6H_{11}$.

In addition to the quinones, other equally suitable oxidizing agents in the novel process are benzoid and/or non-benzoid quinone methides such as are also described in, for example, The Chemistry of Quinoid Compounds (loc. cit.). Regarding suitable quinone methides, reference may also be made to J. K. Perlstein, Angew. Chem. 89 (1977), 534–549. Typical quinone methides are

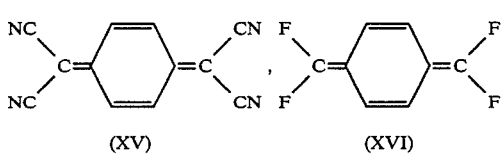

(XV)    (XVI)

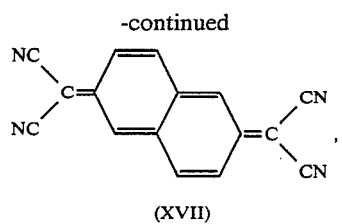

(XVII)

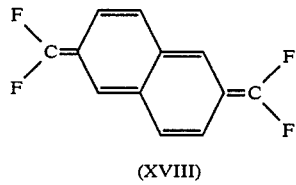

(XVIII)

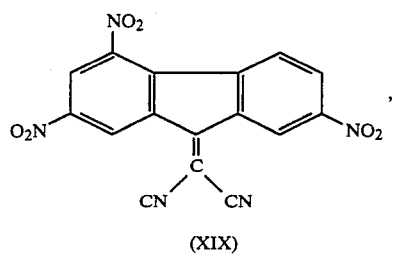

(XIX)

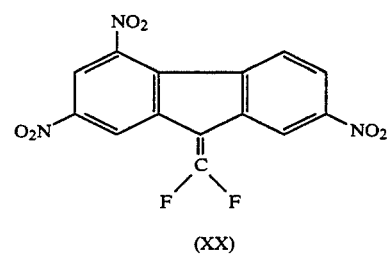

(XX)

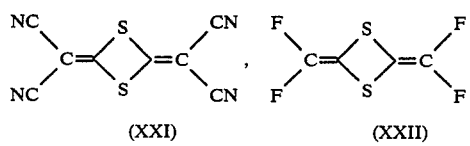

(XXI)    (XXII)

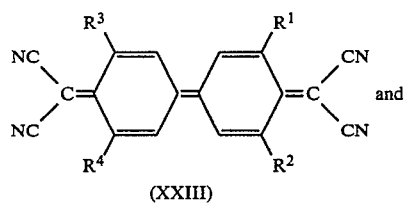

(XXIII)

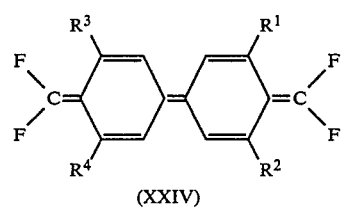

(XXIV)

In formulae (XXIII) and (XXIV), $R^1$, $R^2$, $R^3$ and $R^4$ are identical or different and are each H, F, Cl, Br, I, CN, $CF_3$, $C_2F_5$, OH, $NO_2$, $COOR^5$ or $OR^5$, where $R^5$ is alkyl (in particular $C_1$–$C_8$-alkyl, preferably $CH_3$, $C_2H_5$, $C_3H_7$ or $C_4H_9$), cycloalkyl (in particular $C_6$–$C_{12}$-cycloalkyl, preferably $C_6H_{11}$) or aryl (in particular phenyl). Preferred compounds of the formulae (XXIII)

and (XXIV) are those in which $R^1$, $R^2$, $R^3$ and $R^4$ are identical and are each H, CL, Br or CN.

Organic electron acceptors which can be particularly advantageously employed as oxidizing agents in the process according to the invention also include the known nitroaromatics, as described in, for example, The Chemistry of Nitro and Nitroso Groups, Parts 1 and 2, in The Chemistry of Functional Groups, series editor S. Patai, Interscience Publishers, New York (1970). In addition to the above compounds of the formulae (XIX) and (XX), examples of nitroaromatics which are preferably used as oxidizing agents are

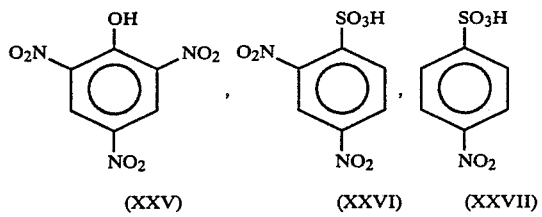

(XXV), (XXVI), (XXVII)

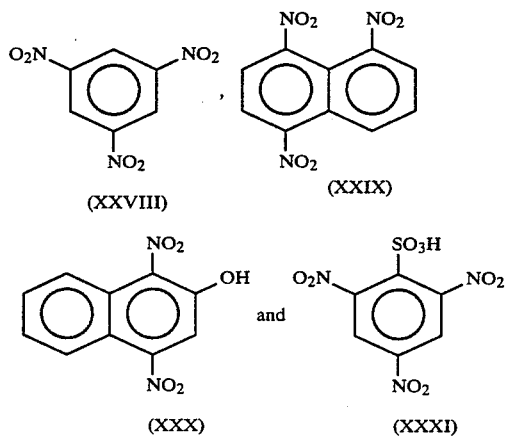

(XXVIII), (XXIX), (XXX) and (XXXI)

The oxidation is advantageously carried out in the presence of a solvent, preferably in an inert chlorohydrocarbon or chlorofluorohydrocarbon. For this purpose, the metal chelate is reacted in general with a 1.5-fold to 10-fold molar excess of the organic electron acceptor, dissolved in a suitable solvent, at about +40° to +100° C., preferably at the boil, for several hours or days, and the air-stable, electrically conductive polymeric system is precipitated. To achieve maximum electrical conductivity, the oxidation is preferably carried out under an inert gas atmosphere, preferably under argon or nitrogen.

The insoluble electrically conductive polymeric system is isolated from the reaction solution by filtration, washed with a chlorohydrocarbon or chlorofluorohydrocarbon and dried under reduced pressure for several hours.

In the process according to the invention, a 1,9-substituted phenalene of the general formula (I) is reacted with a metal cation of an element of sub-group VII, VIII or I of the periodic table, preferably with a cation of Fe, Ni, Pd, Pt or Cu, particularly preferably with a cation of Ni or Pd, to give, initially, a bis-(chelate)metal of the general formula (Ia)

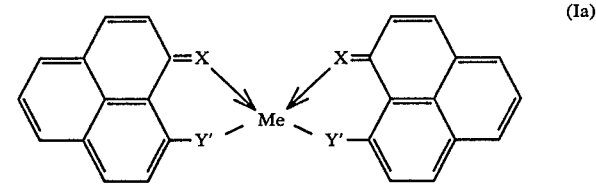

where X is O, NH, S, Se or Te, Y' is —O—, —NH— or —S— and Me is one of the above metals. X is preferably O, NH or S, in particular O, and Y' is preferably —O— or —NH—, in particular —NH—. The metal chelate (Ia) is then oxidized with an organic electron acceptor (OEA) to give the novel air-stable, electrically conductive system of the general formula (Ib)

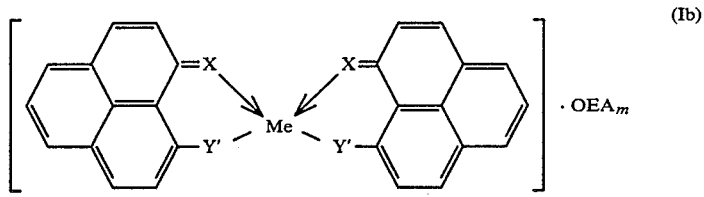

where X, Y' and Me have the above meanings and m is an integer from 1 to 5. Preferred compounds (Ib) are bis-(9-aminophenalen-1-onato)-Ni.OEA$_{1-5}$ and bis-(9-aminophenalen-1-onato)-Pd.OEA$_{1-5}$.

By means of the above procedures, the electrical conductivities can be increased by a few orders of magnitude. The initial conductivity of the metal chelate (Ia) is $10^{-12}\Omega^{-1}cm^{-1}$, while the novel system of the general formula (Ib) has an electrical conductivity greater than $10^{-3}\Omega^{-1}cm^{-1}$, and is stable in air. The electrically conductive polymeric systems prepared according to the invention are p-conductors (cf. J. Chem. Educ. 46 (2) (1969), 82), which are useful for the antistatic treatment of plastics, for producing solar cells, for converting and fixing radiation and for producing electric and magnetic switches and electrochemical stores.

The Examples which follow illustrate the invention. Parts and percentages are by weight, unless stated otherwise.

EXAMPLE 1 a. Preparation of bis-(9-aminophenalen-1-onato)-Ni (II)

0.1 mole of 9-aminophenalen-1-one were dissolved in 700 ml of ethanol, and the solution was heated at the boil, and a solution of 0.05 mole of Ni(II) acetate.4H$_2$O in 100 ml of ethanol/H$_2$O (volumetric ratio 1:1) was added dropwise. Bis-(9-aminophenalen-1-onato)-Ni (II).2H$_2$O, which is insoluble in ethanol, was formed immediately. The reaction mixture was kept at the boil for a further 2 hour, and the precipitated substance was then isolated, and dehydrated at 50° C. under reduced pressure to give bis(9-aminophenalen-1-onato)-Ni (II) as a blackish violet substance in 80–90% yield. The conductivity was $6.0.10^{-13}\Omega^{-1}cm^{-1}$.

b. Oxidation of the bis-(9-aminophenalen-1-onato)-Ni (II) with chloranil 1 g (2.23 millimoles) of bis-(9-aminophenalen-1-onato)-Ni (II) and 2.22 g (10.0 millimoles) of chloranil in 220 ml of CCl$_4$ were refluxed for from 20 to 30 hours and then cooled to room temperature. The insoluble bis-(9-aminophenalen-1-onato)-Ni.chloranil$_m$ (m=1 or 2) was then isolated, washed with CCl$_4$ and dried at 50° C. in a high vacuum. Yield: 100%; conductivity: $1.3.10^{-1} \Omega^{-1} cm^{-1}$.

EXAMPLE 2

The procedure described in Example 1 was followed, except that, instead of the Ni(II) acetate.4H$_2$O, a corresponding amount of PdCl$_2$.2 acetonitrile was employed in the preparation of the metal chelate. The corresponding Pd(II) complex, which had a conductivity of $5 \times 10^{-12} \Omega^{-1} cm^{-1}$, was obtained. Oxidation of this complex with chloranil by a procedure similar to that described in Example 1b gave an air-stable product having an electrical conductivity of $1.8.10^{+1} \Omega^{-1} cm^{-1}$.

EXAMPLE 3

The procedure described in Example 2 was followed, except that, instead of the chloranil, tetramethyldiphenoquinone was used for the oxidation of the Pd(II) chelate. The product obtained had a long shelf life, and its electrical conductivity was $2.9.10^{+1} \Omega^{-1} cm^{-1}$.

When the above procedure was followed, except that, instead of the tetramethyldiphenoquinone, 1,4-naphthaquinone or one of the compounds of the above general formula (IX), (XI), (XII), (XXIII) where R$^1$, R$^2$, R$^3$ and R$^4$ are each H, (XXIII) where R$^1$, R$^2$, R$^3$ and R$^4$ are each CN, or (XX) was employed, an air-stable polymeric system having an electrical conductivity of from $0.5.10^{-1}$ to $3.5.10^{+1} \Omega^{-1} cm^{-1}$ was obtained.

We claim:

1. A process for the preparation of an air-stable, electrically conductive system having a conductivity greater than $10^{-3} \Omega^{-1} cm^{-1}$, comprising reacting a metal cation of an element of sub-group VII, VIII or I of the periodic table of elements with a 1,9-substituted phenalene of the formula (I)

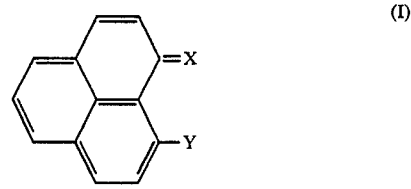

where x is O, NH, S, Se or Te and Y is —OH, —SH or —NH, to give a metal chelate, and reacting this metal chelate with a 1.5-fold to 10-fold molar excess of an organic electron acceptor, in an inert chlorohydrocarbon or chlorofluorohydrocarbon as the solvent, at about +40° to +100° C.

2. A process as claimed in claim 1, wherein a quinone is employed as the oxidizing agent.

3. A process as claimed in claim 1, wherein a quinone methide is employed as the oxidizing agent.

4. A process as claimed in claim 1, wherein a nitroaromatic is employed as the oxidizing agent.

5. A process as claimed in claim 1, wherein an Fe, Ni, Pd, Pt or Cu cation is employed as the metal cation.

6. A process as claimed in claim 1, wherein 9-aminophenalen-1-one is employed as the 1,9-substituted phenalene.

7. An air-stable, electrically conductive system of the formula (Ib)

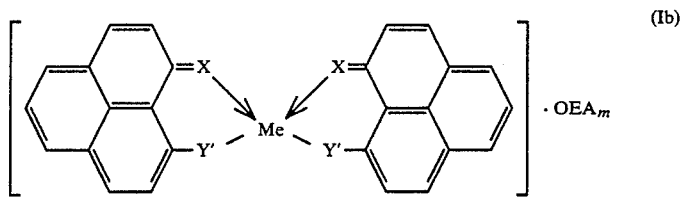

where X is O, NH, S, Se or Te, Y' is —O—, —S— or —NH—, Me is a metal of sub-group VII, VIII or I of the periodic table of elements, OEA is an organic electron acceptor and m is an integer from 1 to 5.

8. An air-stable, electrically conductive system as claimed in claim 7, wherein X is O, NH or S.

9. An air-stable, electrically conductive system as claimed in claim 7, wherein Y' is —NH—.

10. An air-stable, electrically conductive system as claimed in claim 7, wherein Me is Fe, Ni, Pd, Pt or Cu.

11. An air-stable, electrically conductive system as claimed in claim 7, wherein OEA is a quinone, a quinone methide or a nitroaromatic.

* * * * *